(12) United States Patent
Tomomatsu

(10) Patent No.: US 7,928,529 B2
(45) Date of Patent: Apr. 19, 2011

(54) SEMICONDUCTOR DEVICE

(75) Inventor: Hiroyuki Tomomatsu, Oita-ken (JP)

(73) Assignee: Texas Instruments Incorporated, Dallas, TX (US)

( * ) Notice: Subject to any disclaimer, the term of this patent is extended or adjusted under 35 U.S.C. 154(b) by 163 days.

(21) Appl. No.: 12/421,111

(22) Filed: Apr. 9, 2009

(65) Prior Publication Data

US 2009/0278221 A1   Nov. 12, 2009

(30) Foreign Application Priority Data

Apr. 11, 2008   (JP) .................. 2008-103003

(51) Int. Cl.
*H01L 31/102* (2006.01)
*H01L 31/0232* (2006.01)

(52) U.S. Cl. ................. 257/458; 257/432; 257/E31.061

(58) Field of Classification Search .......... 257/414–467, 257/E31.061; 438/63
See application file for complete search history.

(56) References Cited

U.S. PATENT DOCUMENTS

2005/0285215 A1* 12/2005 Lee et al. ............... 257/432
2006/0113622 A1*  6/2006 Adkisson et al. ........ 257/443

FOREIGN PATENT DOCUMENTS

JP   2001-320079   11/2001

* cited by examiner

*Primary Examiner* — Kiesha R Bryant
*Assistant Examiner* — Tucker Wright
(74) *Attorney, Agent, or Firm* — John J. Patti; Wade J. Brady, III; Frederick J. Telecky, Jr.

(57) ABSTRACT

A semiconductor device that attenuates light to the circuit element area is provided. The semiconductor device includes light-sensitive element area formed on substrate and a circuit element area formed on the substrate. Additionally, a multi-layer wiring area is formed on circuit element area. A Tantalum film (which is generally made of tantalum or a tantalum compound) is formed on the surface of the multilayer wiring area to attenuate incident light on circuit element area.

3 Claims, 5 Drawing Sheets

SEMICONDUCTOR DEVICE

CROSS-REFERENCE TO RELATED APPLICATIONS

This application is a claims priority to Japanese Patent Application No. 2008-103003, filed on Apr. 11, 2008, which is hereby incorporated by reference for all purposes.

TECHNICAL FIELD

The invention relates generally to semiconductor device and, more particularly, to a light detector having PIN photodiodes or other light-sensitive elements formed on a substrate.

BACKGROUND

A PIN photodiode is an element that has a P-I-N structure including an Intrinsic layer (high-resistance epitaxial layer or the like) between a p-type semiconductor and an n-type semiconductor, and it converts the incident light into photocurrent. It has the following theory. When light having higher energy than the energy band gap is incident into silicon (Si) having an inversely biased applied PIN structure, electron/hole pairs are generated in the silicon crystal. With them acting as light carriers, the electrons move to the n layer, while the holes move to the p layer. As a result, a current is output in the reverse direction. An example of a conventional PIN device is Japanese Patent Application No. 2001-320079.

SUMMARY

A preferred embodiment of the present invention, accordingly, provides an apparatus. The apparatus comprises a light-sensitive element area formed in a substrate; a circuit element area formed in the substrate; and a wiring area that includes: a first sidewall facing the light-sensitive element area; a second sidewall specifying the outer edge that is formed on the circuit element area; a first and a second metal wiring patterns electrically connected to the circuit elements in the circuit element area; an insulating layer formed on the first and second metal wiring patterns; a film that is made of at least one of tantalum and a tantalum compound, wherein the filed is formed on the insulating layer such that it covers the gap between the first and second metal wiring patterns and extends onto the first and second sidewalls; and an opening formed in the film and at least a portion of the insulating layer under the film, wherein the at least one of the first and second metal wiring patterns is exposed in the opening for external connection.

In accordance with a preferred embodiment of the present invention, the tantalum compound is tantalum nitride (TaN) or tantalum silicon nitride (TaSiN).

In accordance with a preferred embodiment of the present invention, the insulating layer is made of silicon nitride.

In accordance with a preferred embodiment of the present invention, a method is provided. The method comprises forming a light-sensitive element area and a circuit element area; forming a wiring area on the light-sensitive element area and circuit element area; etching at least a portion of the wiring area to form an opening at the position corresponding to the light-sensitive element area; forming a film made of at least one of tantalum and a tantalum compound on the wiring area and the opening; and etching the at least a portion of the film to expose the light-sensitive element area.

In accordance with a preferred embodiment of the present invention, the method further comprises forming an etching stop layer that covers the light-sensitive element area; and etching the wiring area until the etching stop layer is exposed, when the opening is formed.

In accordance with a preferred embodiment of the present invention, the method further comprises etching stop layer is etched to expose the light-sensitive element area.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
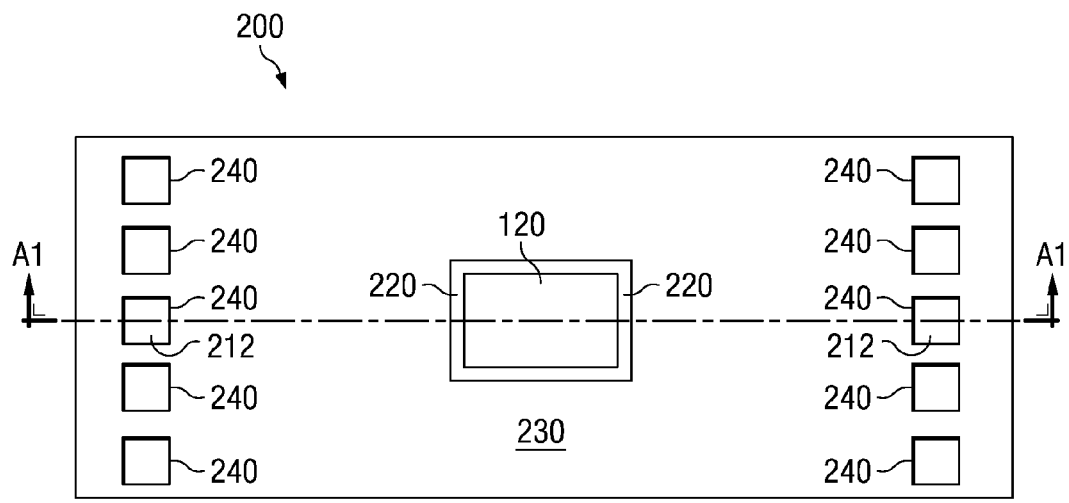
FIG. 1(a) is a plan view illustrating an example of a semiconductor device in accordance with a preferred embodiment of the present invention.

Refer now to the drawings wherein depicted elements are, for the sake of clarity, not necessarily shown to scale and wherein like or similar elements are designated by the same reference numeral through the several views.

Figure 1B:
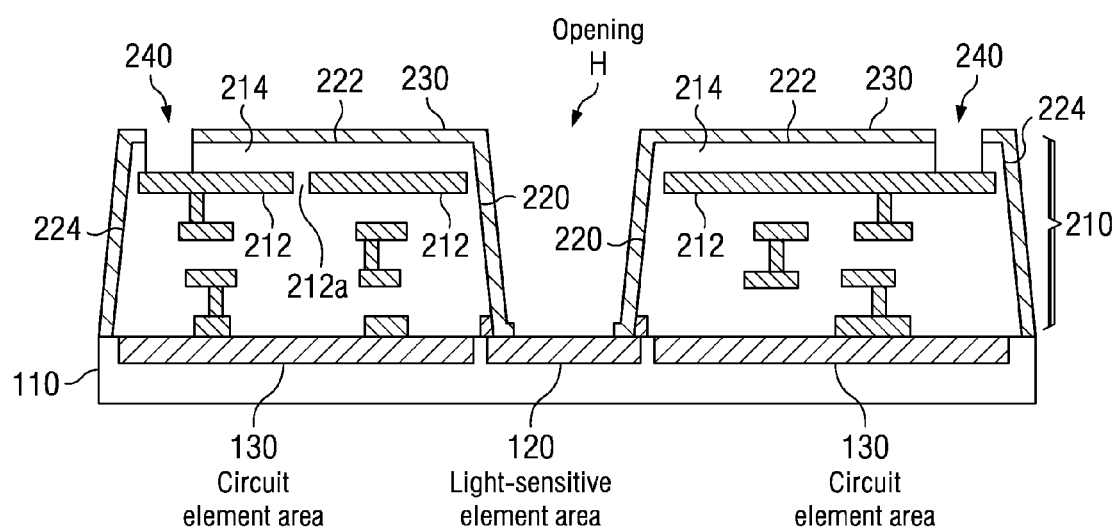
FIG. 1(b) is a cross-sectional view along line A1-A1.

Referring to FIGS. 1(a) and 1(b) of the drawings, the reference numeral 200 generally designates a semiconductor device in accordance with a preferred embodiment of the present invention. Semiconductor device 200 generally comprises a silicon substrate (including a semiconductor layer epitaxially grown on the substrate) 110. Silicon substrate 110 includes light-sensitive element area 120 wherein a PIN photodiode is formed and peripheral circuit area 130 wherein a circuit element used for amplifying voltage converted from current obtained by photoelectric conversion performed by the PIN photodiode is formed.

An antireflection film (for example, a film composed of a silicon oxide film and a silicon nitride film) is usually formed on the surface of light-sensitive element area 120. Reflected light from outside penetrates through the antireflection film and is irradiated on the PIN photodiode formed on the substrate surface. The PIN photodiode forms a depletion area by applying an inverse bias voltage. When light is incident onto the depletion region, electron/hole pairs are generated. The electrons and holes move to inversely biased electrodes, and a photocurrent is detected. After the detected photocurrent is converted into a voltage and is amplified, the voltage is output from an external terminal via a bonding wire formed in contact hole 240, to be described later.

A multilayer wiring area 210 including metal wirings electrically connected to the circuit elements in the circuit element area is formed on silicon substrate 110. For example, multilayer wiring area 210 includes four metal wiring layers. Interlayer insulating films made of phosphosilicate glass (PSG), spin-on glass (SOG), Tetraethyl Orthosilicate (TEOS) or the like are formed between metal wiring layers. The metal wiring layers are electrically connected by via contacts or buried plugs or the like in via holes formed in the interlayer insulating films. The top metal wiring pattern 212 is covered by protective film 214 made of silicon nitride ($Si_3N_4$)

Multilayer wiring area 210 includes a first sidewall 220 that specifies the opening H of light-sensitive element area 120, almost flat surface 222 connected to the first sidewall 220, and a second sidewall 224 that specifies the outer edge of the multilayer wiring area. In the example shown in the figure, the second sidewall 224 faces the scribed area when the chip is cut into a rectangular shape. If another light-sensitive element area is formed adjacently, the second sidewall 224 may also specify the opening of the other light-sensitive element area.

A film 230 made of tantalum (Ta) or a tantalum compound is formed to cover the main portion of multilayer wiring area 210. As shown, the film 230 covers the first sidewall 220, surface 222, and second sidewall 224. However, the film 230 is excluded from contact hole 240 used for realizing contact with the top metal wiring pattern 212. The area exposed by contact hole 240 can function as a bonding pad of the metal wiring pattern. FIGS. 1(*a*) and (*b*) show five contact holes 240 formed side by side in one row.

Since film 230 is a metal film, it can block light. When the surface 222 of multilayer wiring area 210 is covered by film 230, light irradiated on the chip surface is reflected by film 230 so that no light will be incident onto the inside from the gap 212*a* of the top metal wiring pattern 212. Also, when the first sidewall 220 is covered by film 230, it is possible to prevent the incidence portion of the light irradiated on light-sensitive element area 120 into circuit element area 130 from the first sidewall 220. Similarly, when the second sidewall 224 is covered by film 230, it is possible to prevent the incidence of light from the chip edge into the circuit element area.

Film 230 has very high corrosion resistance and heat resistance. Therefore, film 230 can also act as a protective film. Film 230 can be exposed to the air without using another protective film. In addition, film 230 has a very good bonding property to the silicon nitride ($Si_3N_4$) that forms the protective film 214 at its base, and the bonding property can be retained even if the temperature of the substrate varies.

Substrate 110 shown in FIG. 1 is operationally tested prior to packaging. A multiprobe is brought into contact with contact hole 240, and light is irradiated on light-sensitive element area 120. In the test, an LED light source is usually used instead of a laser light source. The use of a laser is limited since lasers have a high safety standard. The light emitted on LED is different from laser light. Since the divergence angle is large, it irradiates not only the opening H of the light-sensitive element area, but the entire chip. In this embodiment, since a tantalum film is formed in the main portion of the multilayer wiring area, the LED light is reflected by the tantalum film and will not be incident into the circuit element area. In this way, a highly reliable test result can be obtained.

Figure 2A:
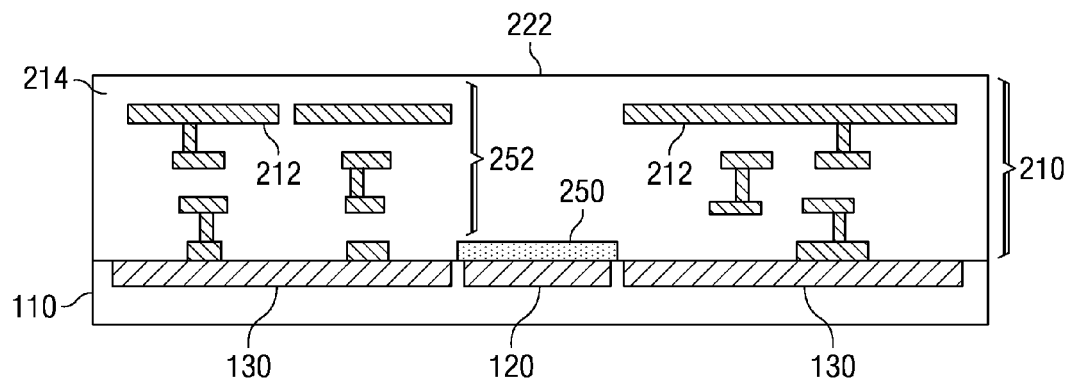
FIG. 2-5 are a cross-sectional view illustrating examples of portions of fabricating methods in accordance with a preferred embodiment of the present invention.
Figure 2B:
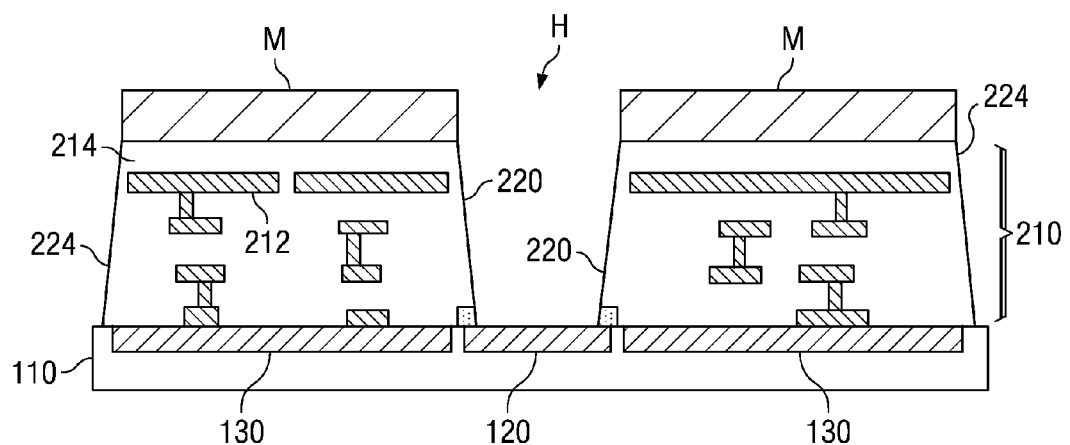
Figure 2C:
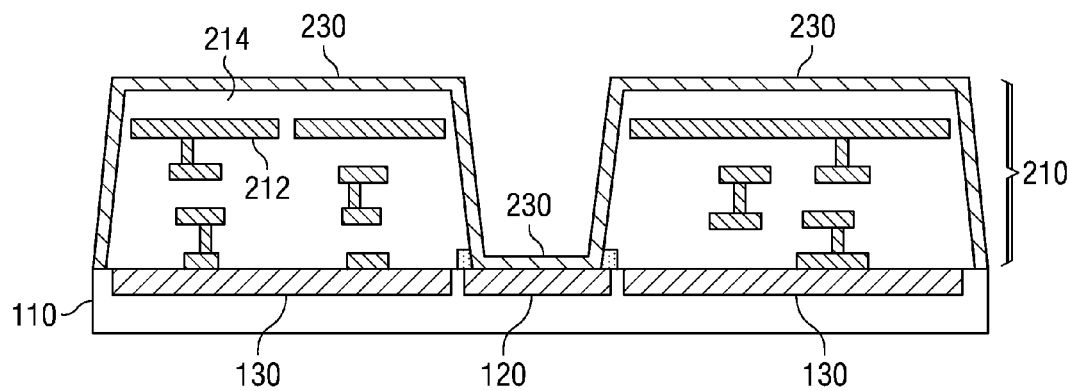

As shown in FIG. 2(*a*), circuit element area 130, light-sensitive element area 120, and multilayer wiring area 210 are formed on a substrate. At that time, multilayer wiring area 210 is also arranged on light-sensitive element area 120, and an etching stop layer 250 is formed on light-sensitive element area 120. The etching stop layer 250 can be either a metal layer formed simultaneously when forming the metal wiring pattern of multilayer wiring area 210 or an insulating layer. However, it is preferable to use a material having a high etching selection ratio with respect to the interlayer insulating film (including protective film 214) 252 of multilayer wiring area 210.

Then, as shown in FIG. 2(*b*), conventional photolithographic technology is used to form mask M on the substrate, and multilayer wiring area 210 exposed by mask M is etched. It is preferable to carry out etching in two steps. In the first etching step, interlayer insulating film 252 is removed, for example, by means of dry etching, until etching stop layer 250 is exposed. Then, etching stop layer 250 is removed by means of wet etching to expose light-sensitive element area 120 (antireflection film). In this way, a rectangular opening H is formed in multilayer wiring area 210. Since etching stop layer 250 has a high etching selection ratio with respect to interlayer insulating film 252 as described above, the etching can be correctly stopped by etching stop layer 250. Also, a slightly tapered shape is formed for the first sidewall 220 or second sidewall 224 that specifies the opening H as a result of dry etching.

Then, after mask M is removed, as shown in FIG. 2(*c*), film 230 is formed on the entire surface of the substrate. It is preferable to form film 230 by means of sputtering using a PVD apparatus. Its film thickness is 2300±400 Å. Since the aspect of opening H is low, film 230 is formed at an almost uniform film thickness on the first and second sidewalls.

Figure 3A:
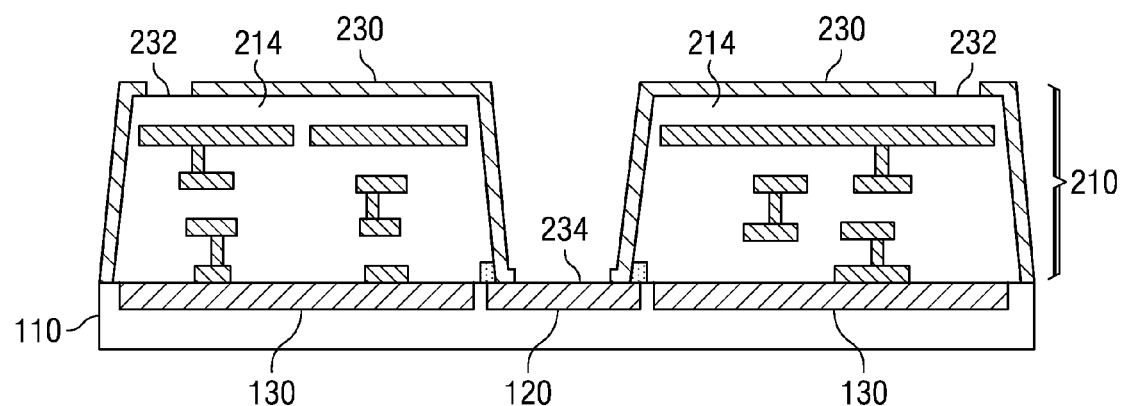
Figure 3B:
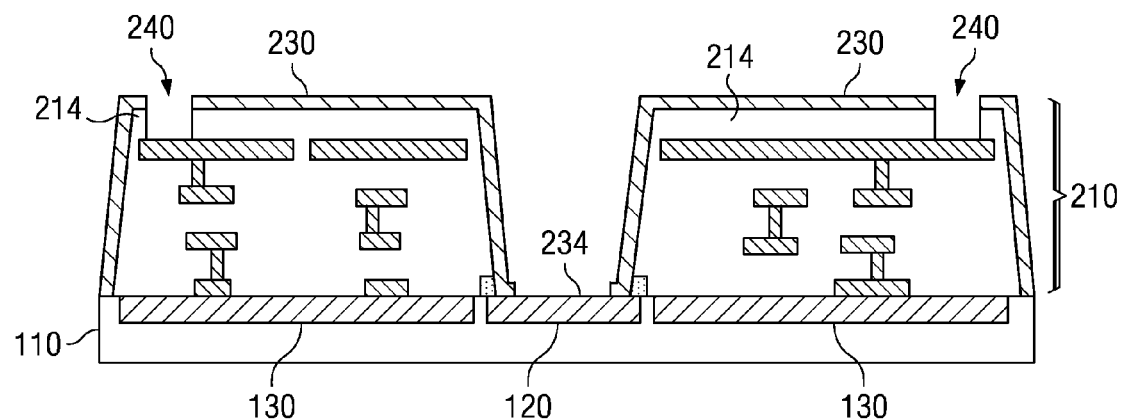

Then, as shown in FIG. 3, conventional photolithographic technology is used to patternize film 230. In other words, when film 230 is processed by means of etching, opening 232 is formed at a position corresponding to a bonding pad area, and opening 234 is formed at the position corresponding to light-sensitive element area 120. Film 230 is etched by plasma or a chemical solution composed of an acid mixture.

Then, as shown in FIG. 3(*b*), contact hole 240 is formed on protective film 214 exposed by film 230, and metal wiring pattern 212 is exposed. Then, the exposed metal wiring pattern 212 is electrically connected to an external terminal by a bonding wire.

Figure 4A:
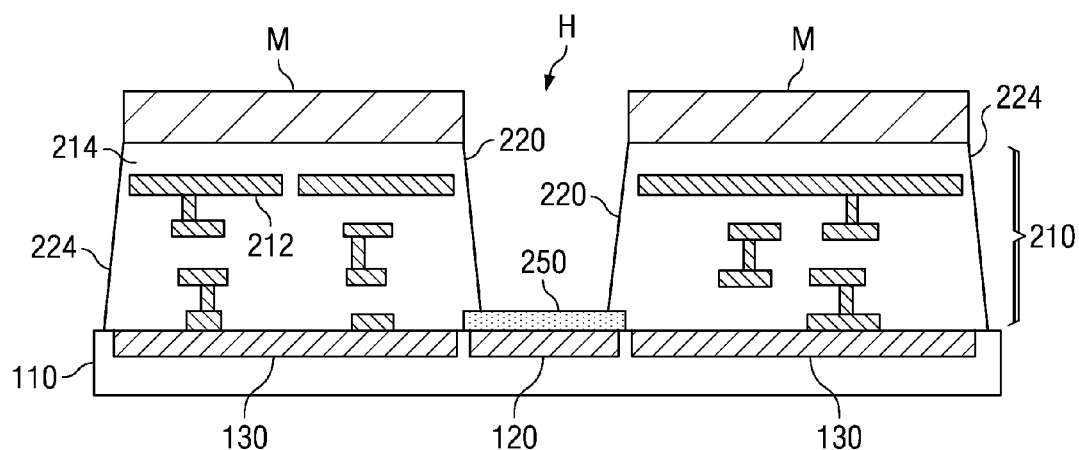
Figure 4B:
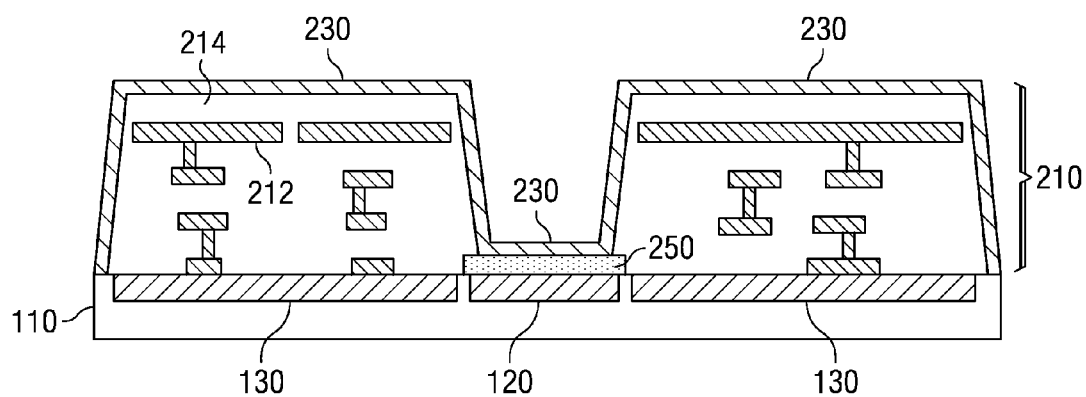
Figure 4C:
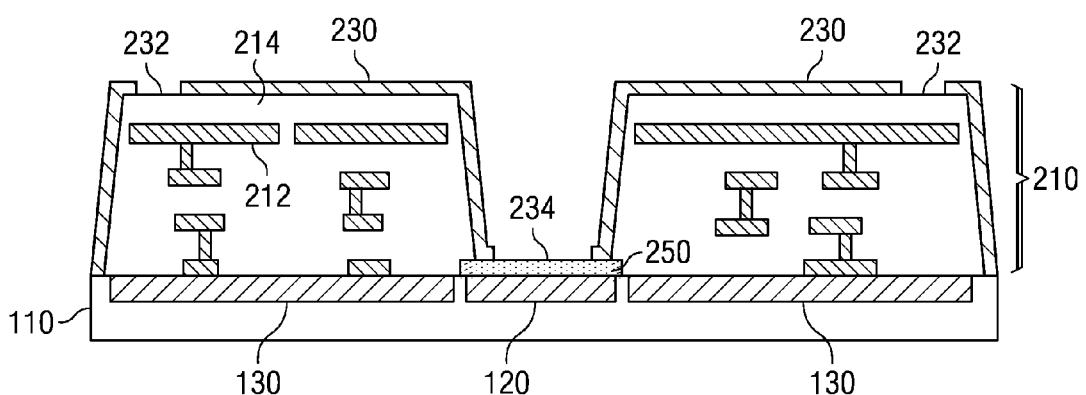

Similar to the method shown in FIG. 2(*a*), light-sensitive element area 120, circuit element area 130, and multilayer wiring area 210 are formed on substrate 110. As shown in FIG. 4(*a*), mask M is formed on multilayer wiring area 210. Then, the interlayer insulating film 252 (including protective film 214) of multilayer wiring area 210 exposed through mask M is etched to form opening H. The etching is performed until etching stop layer 250 is exposed. In this way, the first sidewall 220 and the second sidewall 224 are formed in multilayer wiring area 210. In this method, etching stop layer 250 is left as is.

Then, as shown in FIG. 4(*b*), film 230 is formed on the entire surface of the substrate, including opening H. Then, as shown in FIG. 4(*c*), film 230 is processed to form opening 232 at a position corresponding to a bonding pad area, and to form opening 234 at the position corresponding to light-sensitive element area 120. Since light-sensitive element area 120, especially the antireflection film on the surface, is covered by etching stop layer 250, it is protected from the damage caused by etching of film 230.

Figure 5A:
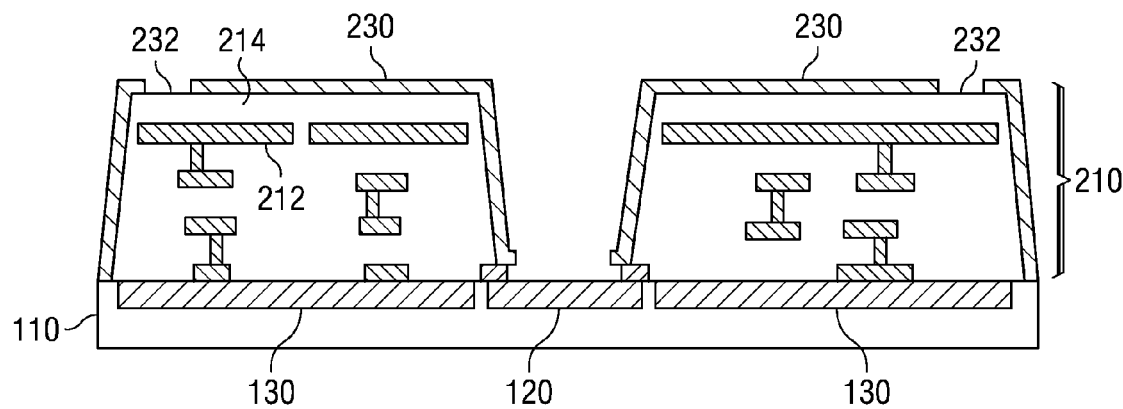
Figure 5B:
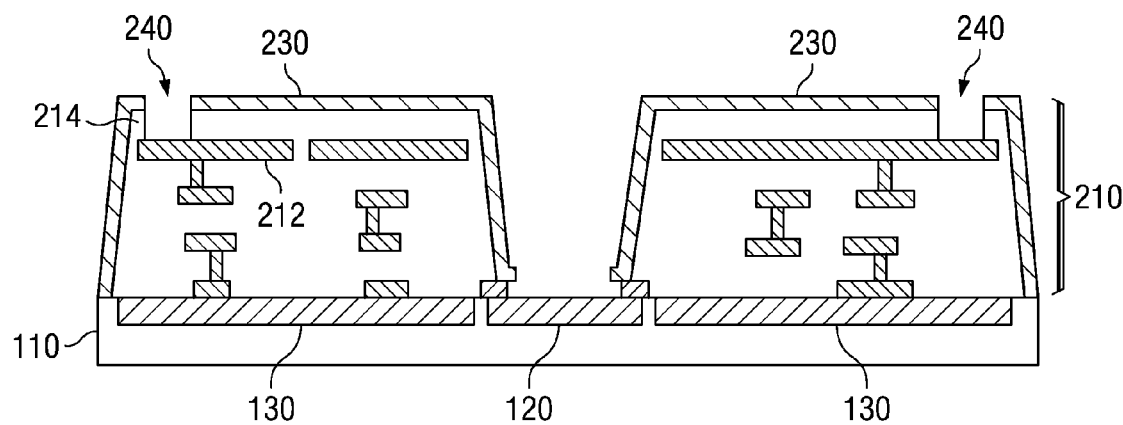

Then, as shown in FIG. 5(*a*), etching stop layer 250 is eliminated by means of wet etching, and light-sensitive element area 120 is completely exposed. Finally, as shown in FIG. 5(*b*), protective film 214 is removed from the position corresponding to the opening 232 of multilayer wiring area 210, and contact hole 240 is formed.

When etching stop layer 250 is used for both etching of interlayer insulating film 252 and etching of film 230, the etching damage of light-sensitive element area 120 can be minimized.

As described above, the main portion of multilayer wiring area 210 is covered by film 230. However, it is also possible to form film 230 on a portion of the surface 222 of multilayer wiring area 210. In this case, it is preferable to form film 230 at a position that covers gap 212a between the top metal wiring patterns 212. It is also possible to form film 230 on a portion of the first sidewall 220 or second sidewall 224.

Also as described above, film 230 is used. However, it is also possible to use tantalum nitride (TaN), tantalum silicon nitride (TaSiN), or other tantalum compounds. The tantalum compounds have the same excellent corrosion resistance as a tantalum film. Tantalum does not hinder the lamination structure with other layers.

As described, there is only one light-sensitive element area 120. However, it is also possible to form plural light-sensitive element areas on a substrate. Also, the opening H of the light-sensitive element area is not limited to a rectangular shape but may also have a cylindrical shape or conical shape. In the aforementioned embodiment, a bonding wire is connected in contact hole 240. However, it is also possible to use a bump or other connection members.

Figure 6:
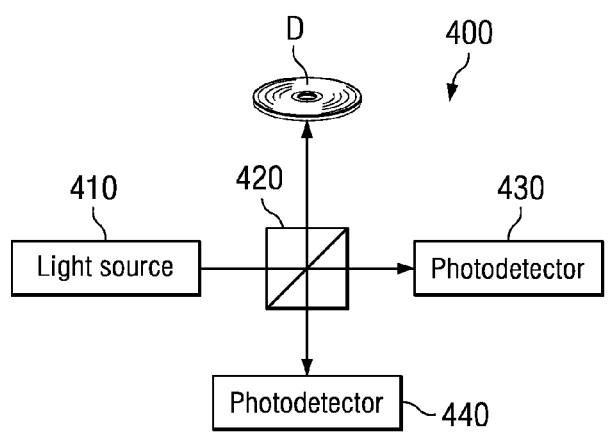
FIG. 6 is a diagram illustrating an example that uses the semiconductor device of FIGS. 1(a) through 5.

FIG. 6 shows an example of the configuration of an optical pickup. Optical pickup 400 is a device that optically reads data recorded on a disc driven to rotate or optically writes data on the disc. Optical pickup 400 includes a light source 410, including a laser element or a laser diode element that emits blue light, splitter 420, and photodetectors 430, 440. Splitter 420 reflects the blue light emitted from light source 410 to disc D and allows penetration of a portion of the light to photodetector 430 as well as penetration of reflected light from disc D to photodetector 440. Photodetector 430 monitors the light output of light source 410, and the light output of the blue light is stabilized based on the monitoring result. Photodetector 440 monitors the reflected light from disc D, and focus control or tracking control is performed based on the monitoring result. Also, photodetector 440 is used to read the data written on disc D.

Semiconductor device 200 disclosed in the aforementioned embodiment is used for the photodetectors 430, 440. Photodetectors 430, 440 include a PIN photodiode used for detecting the blue light. The circuit used for amplifying or processing the signal detected by the PIN photodiode is integrated on one silicon chip. The integrated circuit includes plural MOS transistors, bipolar transistors, and the like. Also, the light detected by the PIN photodiode is not limited to blue light but can also be red light or light with other wavelengths.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a light-sensitive element area formed in a substrate;
    a circuit element area formed in the substrate; and
    a wiring area that includes:
        a first sidewall facing the light-sensitive element area;
        a second sidewall specifying the outer edge that is formed on the circuit element area;
        a first and a second metal wiring patterns electrically connected to the circuit elements in the circuit element area;
        an insulating layer formed on the first and second metal wiring patterns;
        a film that is made of at least one of tantalum and a tantalum compound, wherein the film is formed on the insulating layer such that it covers the gap between the first and second metal wiring patterns and extends onto the first and second sidewalls; and
        an opening formed in the film and at least a portion of the insulating layer under the film, wherein the at least one of the first and second metal wiring patterns is exposed in the opening for external connection.

2. The apparatus of claim 1, wherein the tantalum compound is tantalum nitride (TaN) or tantalum silicon nitride (TaSiN).

3. The apparatus of claim 2, wherein the insulating layer is made of silicon nitride.

* * * * *